(12) United States Patent
Zhao et al.

(10) Patent No.: US 11,192,388 B2
(45) Date of Patent: Dec. 7, 2021

(54) PRINTING HEAD MODULE, SYSTEM AND METHOD FOR PRINTING LASER SOURCES

(71) Applicant: INSTITUTE OF CHEMISTRY, CHINESE ACADEMY OF SCIENCES, Beijing (CN)

(72) Inventors: Yongsheng Zhao, Beijing (CN); Jiannian Yao, Beijing (CN); Jinyang Zhao, Beijing (CN); Yongli Yan, Beijing (CN)

(73) Assignee: INSTITUTE OF CHEMISTRY, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/614,753

(22) PCT Filed: May 4, 2018

(86) PCT No.: PCT/CN2018/085670
§ 371 (c)(1),
(2) Date: Nov. 18, 2019

(87) PCT Pub. No.: WO2018/210142
PCT Pub. Date: Nov. 22, 2018

(65) Prior Publication Data
US 2020/0079107 A1    Mar. 12, 2020

(30) Foreign Application Priority Data

May 19, 2017  (CN) .......................... 201710358465.8
May 19, 2017  (CN) .......................... 201710358471.3
(Continued)

(51) Int. Cl.
*B41J 2/435*     (2006.01)
*B41J 2/44*      (2006.01)
(Continued)

(52) U.S. Cl.
CPC ............... *B41J 2/442* (2013.01); *B41J 3/546* (2013.01); *B41M 3/006* (2013.01);
(Continued)

(58) Field of Classification Search
None
See application file for complete search history.

(56) References Cited

U.S. PATENT DOCUMENTS 7,887,887 B2 *  2/2011  Cho ..................... C09D 177/12
                                            427/420
8,042,899 B2    10/2011 Folkins et al.
(Continued)

FOREIGN PATENT DOCUMENTS

CN     1303228 A    7/2001
CN     1476973 A    2/2004
(Continued)

*Primary Examiner* — Erica S Lin
*Assistant Examiner* — Tracey M McMillion
(74) *Attorney, Agent, or Firm* — Novick, Kim & Lee, PLLC; Allen Xue

(57) ABSTRACT

A printing head module, system and method for printing laser light sources. The printing head module comprises one or more printing heads used for printing a plurality of laser light sources on a substrate successively or once for all; ink used for printing comprises a luminescent dye and a host material, as well as a solvent. The system comprises a printing head module and an ink cartridge; the printing head module is used for inkjet printing the laser light sources on the substrate; the ink cartridge is used for storing ink. By means of the technical solution, industrial manufacturing of the laser light sources is achieved, and speckles caused by laser coherence are eliminated.

11 Claims, 1 Drawing Sheet

(30) Foreign Application Priority Data

| | | |
|---|---|---|
| May 19, 2017 | (CN) | 201710359070.X |
| May 19, 2017 | (CN) | 201710359076.7 |
| May 19, 2017 | (CN) | 201710359566.7 |
| May 19, 2017 | (CN) | 201710359567.1 |
| May 19, 2017 | (CN) | 201710359582.6 |
| May 19, 2017 | (CN) | 201710361265.8 |

(51) Int. Cl.

| | |
|---|---|
| *B41J 3/54* | (2006.01) |
| *C09D 11/328* | (2014.01) |
| *C09D 11/107* | (2014.01) |
| *C09D 11/108* | (2014.01) |
| *H01S 5/36* | (2006.01) |
| *H01S 5/40* | (2006.01) |
| *B41M 3/00* | (2006.01) |
| *B41M 5/00* | (2006.01) |
| *G09G 3/02* | (2006.01) |

(52) U.S. Cl.
CPC ......... *B41M 5/0023* (2013.01); *C09D 11/107* (2013.01); *C09D 11/108* (2013.01); *C09D 11/328* (2013.01); *G09G 3/02* (2013.01); *H01S 5/36* (2013.01); *H01S 5/4093* (2013.01)

(56) References Cited

U.S. PATENT DOCUMENTS

| | | | |
|---|---|---|---|
| 8,714,692 | B1 | 5/2014 | Metcalfe et al. |
| 8,955,937 | B2 | 2/2015 | Metcalfe et al. |
| 8,985,723 | B2 | 3/2015 | Metcalfe et al. |
| 9,573,382 | B1 | 2/2017 | Metcalfe et al. |
| 2005/0100660 | A1 | 5/2005 | Ito et al. |
| 2006/0054040 | A1* | 3/2006 | Daems .................. B41C 1/003 101/463.1 |
| 2007/0040500 | A1* | 2/2007 | Fukuda ................ C03C 17/245 313/512 |
| 2009/0297694 | A1* | 12/2009 | Yamazaki ........... H01L 51/0005 427/66 |

FOREIGN PATENT DOCUMENTS

| | | | |
|---|---|---|---|
| CN | 1701641 | A | 11/2005 |
| CN | 1824713 | A | 8/2006 |
| CN | 1876375 | A | 12/2006 |
| CN | 101353472 | A | 1/2009 |
| CN | 104619794 | A | 5/2015 |
| JP | 01313566 | A * | 12/1989 |

\* cited by examiner

PRINTING HEAD MODULE, SYSTEM AND METHOD FOR PRINTING LASER SOURCES

TECHNICAL FIELD

The present invention belongs to the field of laser, and relates to a printing head module, system and method for painting laser sources.

BACKGROUND ART

For the field of laser, on the one hand, the current laser display technology, due to laser speckles caused by interference effects of strong coherence of laser which seriously reduces display quality, has to use vibrating screen to eliminate speckles. On the another hand, in the prior art, there is also a lack of technology in the prior art for rapid and mass-manufacturing of laser sources and enabling each sources to emit laser in different colors.

DETAILED DESCRIPTION OF THE INVENTION

To solve the above problems, the present invention provides a printing head module for printing laser sources, comprising:

one or more printing heads, which are used for printing a plurality of laser light sources on a substrate successively or once for all;

ink used for printing comprises a luminescent dye, a matrix material and a solvent.

Preferably, the laser sources are used to be combined into multiple independent laser source modules;

in each set of independent laser source modules, at least two of the light sources are capable of emitting light in different colors under the same excitation conditions.

Preferably, sizes of the printing heads are determined by a size of each light source.

Preferably, the scale of the laser sources is millimeter, micrometer or even smaller.

Preferably, a voltage applied to the printing heads can be controlled to adjust the sizes of ink droplets during printing.

Preferably, the luminescent dye comprises: photoinduced laser dyes, electroluminescent laser dyes.

Preferably, the luminescent dye comprises: a blue-emitting oligostyrene dye, a green-emitting coumarin dye, a rhodamine series of dye, a red-emitting hemicyanine dye or their mixtures. For example, Coumarin 153, or Coumarin 6 or Rhodamine 6G dye.

Preferably, the matrix material comprises: polystyrene, polymethyl methacrylate, NOA series of light curable materials or their mixtures.

Preferably, the ink comprises water, dichloromethane, chloroform, dimethylformamide or their mixtures as a solvent.

Preferable, the ink may adopt any one of the following formulations:

three laser dyes, symmetrical diphenylethylene, fluorescein sodium and rhodamine B, are added into a BSA aqueous solution of 300-1000 mg/mL respectively, in which a mass ratio of the three dyes to BSA are 1-3%, respectively, and then glycerol is added. A volume ratio of glycerol to water is 1:1-4, preferably 1:2;

more preferable, the ink may adopt any one of the following formulations:

(1) three laser dyes, symmetrical diphenylethylene, fluorescein sodium and rhodamine B, are added into a BSA aqueous solution of 400 mg/mL, respectively, in which a mass ratio of the three dyes to BSA are all 1%. Finally, glycerol is added, in which a volume ratio of glycerol to water is 1:2;

(2) three laser dyes, symmetrical diphenylethylene, fluorescein sodium and rhodamine B, are added into a BSA aqueous solution of 800 mg/mL, respectively, in which a mass ratio of the three dyes to BSA are all 1%. Finally, glycerol is added, in which a volume ratio of glycerol to water is 1:2;

(3) three laser dyes, symmetrical diphenylethylene, fluorescein sodium and rhodamine B, are added into a BSA aqueous solution of 500 mg/mL, respectively, in which a mass ratio of diphenylethylene, fluorescein sodium and rhodamine B to BSA are 2%, 2%, and 1%, respectively. Finally, glycerol is added, in which a volume ratio of glycerol to water is 1:2.

Preferably, the ink also comprises an auxiliary material; the auxiliary material comprises liquid prepolymer.

Preferably, the ink also comprises an auxiliary material; the auxiliary material comprises: heat curable epoxy resins, NOA series of light curable adhesives or their mixtures.

Preferably, the laser sources comprise RGB three primary color light sources.

Preferably, the space between the laser sources is about 2.5-4 times their diameters.

Preferably, for each group of RGB three primary color light sources, the diameters of the three primary color light sources are basically the same and are located at three vertices of an equilateral triangle, respectively, and a length of the equilateral triangle exceed 10%-30% of the diameters.

To solve the above problems, the present invention provides a system for printing laser sources, comprising:

printing head modules, an ink cartridge and a substrate;

the printing head modules are used for inkjet printing each laser source on the substrate;

the ink cartridge is used to store ink; wherein, the ink comprises a luminescent dye, a matrix material and a solvent.

Preferably, the system further includes: manufacturing lattice modules, which are used to make a lattice pattern corresponding to the positions of the laser sources on a clean substrate.

Preferably, the system further comprises: curing modules, which are used to solidify the laser sources after printing each laser source.

Preferably, the scale of the laser sources is millimeter, micrometer or even smaller.

Preferably, the luminescent dye comprises: photoinduced laser dyes, or electroluminescent laser dyes.

Preferably, the luminescent dye comprises: a blue-emitting oligostyrene dye, a green-emitting coumarin dye, a rhodamine series of dye, a red-emitting hemicyanine dye. For example, Coumarin 153, or Coumarin 6 or Rhodamine 6G dye.

Preferred luminescent dye comprises symmetrical diphenylethylene, fluorescein sodium, rhodamine B, and their mixtures, more preferably a mixture of the three.

Preferably, therein, the matrix material comprises: polystyrene, polymethyl methacrylate, NOA series of light curable materials or their mixtures.

Preferably, the ink comprises water, dichloromethane, chloroform, dimethylformamide or their mixtures as a solvent.

Preferable, the ink may adopt any one of the following formulations:

three laser dyes, symmetrical diphenylethylene, fluorescein sodium and rhodamine B, are added into a BSA aqueous solution of 300-1000 mg/mL respectively, in which a mass ratio of the three dyes to BSA are 1-3%, respectively, and then glycerol is added. A volume ratio of glycerol to water is 1:1-4, preferably 1:2;

more preferable, the ink may adopt any one of the following formulations:

(1) three laser dyes, symmetrical diphenylethylene, fluorescein sodium and rhodamine B, are added into a BSA aqueous solution of 400 mg/mL, respectively, in which a mass ratio of one of the three dyes to BSA are all 1%. Finally, glycerol is added, in which a volume ratio of glycerol to water is 1:2;

(2) three laser dyes, symmetrical diphenylethylene, fluorescein sodium and rhodamine B, are added into a BSA aqueous solution of 800 mg/mL, respectively, in which a mass ratio of one of the three dyes to BSA are all 1%. Finally, glycerol is added, in which a volume ratio of glycerol to water is 1:2;

(3) three laser dyes, symmetrical diphenylethylene, fluorescein sodium and rhodamine B, are added into a BSA aqueous solution of 500 mg/mL, respectively, in which a mass ratio of diphenylethylene, fluorescein sodium and rhodamine B to BSA are 2%, 2%, and 1%, respectively. Finally, glycerol is added, in which a volume ratio of glycerol to water is 1:2.

Preferably, the ink also comprises an auxiliary material; the auxiliary material comprises liquid prepolymer.

Preferably, the ink also comprises an auxiliary material; the auxiliary material comprises: heat curable epoxy resins, NOA series of light curable adhesives.

Preferably, the laser sources comprise RGB three primary color light sources.

Preferably, the printed laser sources are used to be combined into multiple independent laser source modules; in each set of the multiple independent laser source modules, at least two of the light sources are capable of emitting light in different colors under the same excitation conditions.

Preferably, the printing head modules comprise one or more printing heads, which are used for printing successively, or printing multiple laser sources once for all; sizes of the printing heads are determined by a size of each light source.

Preferably, the space between the laser sources is about 2.5-4 times their diameters.

Preferably, the temperature and time during the process of heating are determined by the inherent characteristics of ink.

Preferably, for each group of RGB three primary color light sources, the diameters of the three primary color light sources are basically the same and are located at three vertices of an equilateral triangle, respectively, and a length of the equilateral triangle exceed 10%-30% of the diameters.

To solve the above problems, the present invention provides a method for printing laser sources, comprising the following steps:

S100: placing the pretreated substrate in the work area of an inkjet printer, wherein, the ink used in the inkjet printer comprises a luminescent dye, a matrix material and a solvent;

S200: using the ink to print each laser source on the substrate.

Preferably, the pretreatment comprises the following steps:

S101: making a lattice pattern corresponding to the positions of the laser sources on a clean substrate.

Preferably, the method further comprises the following steps:

S300: curing the laser sources after printing each laser source.

Preferably, the scale of the laser sources is millimeter, micrometer or even smaller.

Preferably, the luminescent dye comprises: photoinduced laser dyes, or electroluminescent laser dyes.

Preferably, the luminescent dye comprises: a blue-emitting oligostyrene dye, a green-emitting coumarin dye, a rhodamine series of dye, a red-emitting hemicyanine dye. For example, Coumarin 153, or Coumarin 6 or Rhodamine 6G dye.

Preferred luminescent dye comprises symmetrical diphenylethylene, fluorescein sodium, rhodamine B, and their mixtures, more preferably a mixture of the three.

Preferably, therein, the matrix material comprises: polystyrene, polymethyl methacrylate, NOA series of light curable materials or their mixtures.

Preferably, the ink comprises water, dichloromethane, chloroform, dimethylformamide or their mixtures as a solvent.

Preferable, the ink may adopt any one of the following formulations:

three laser dyes, symmetrical diphenylethylene, fluorescein sodium and rhodamine B, are added into a BSA aqueous solution of 300-1000 mg/mL respectively, in which a mass ratio of one of the three dyes to BSA are 1-3%, respectively, and then glycerol is added. A volume ratio of glycerol to water is 1:1-4, preferably 1:2;

more preferable, the ink may adopt any one of the following formulations:

(1) three laser dyes, symmetrical diphenylethylene, fluorescein sodium and rhodamine B, are added into a BSA aqueous solution of 400 mg/mL, respectively, in which a mass ratio of one of the three dyes to BSA are all 1%. Finally, glycerol is added, in which a volume ratio of glycerol to water is 1:2;

(2) three laser dyes, symmetrical diphenylethylene, fluorescein sodium and rhodamine B, are added into a BSA aqueous solution of 800 mg/mL, respectively, in which a mass ratio of one of the three dyes to BSA are all 1%. Finally, glycerol is added, in which a volume ratio of glycerol to water is 1:2;

(3) three laser dyes, symmetrical diphenylethylene, fluorescein sodium and rhodamine B, are added into a BSA aqueous solution of 500 mg/mL, respectively, in which a mass ratios of diphenylethylene, fluorescein sodium and rhodamine B to BSA are 2%, 2%, and 1%, respectively. Finally, glycerol is added, in which a volume ratio of glycerol to water is 1:2.

Preferably, the ink also comprises an auxiliary material; the auxiliary material comprises liquid prepolymer.

Preferably, the ink also comprises an auxiliary material; the auxiliary material comprises any one of heat curable epoxy resins, NOA series of light curable adhesives, or their mixtures.

Preferably, the laser sources comprise RGB three primary color light sources.

Preferably, the printed laser sources are used to be combined into multiple independent laser source modules; in each set of the multiple independent laser source modules, at least two of the light sources are capable of emitting light in different colors under the same excitation conditions.

Preferably, the inkjet printer comprises one or more printing heads, which are used for printing successively, or printing multiple laser sources once for all; sizes of the printing heads are determined by a size of each light source.

Preferably, the space between the laser sources is about 2.5-4 times their diameters.

Preferably, the temperature and time during the process of heating are determined by the inherent characteristics of ink.

Preferably, for each group of RGB three primary color light sources, the diameters of the three primary color light sources are basically the same and are located at three vertices of an equilateral triangle, respectively, and a length of the equilateral triangle exceed 10%-30% of the diameters.

Advantageous Effects of the Present Invention

1. According to many technical solutions provided by the present invention, firstly, it is implemented that laser sources are fabricated by inkjet printing, which provides a new technical solution for the cheap and industrial manufacturing of various laser sources and their display devices; secondly, since it is easy to be implemented that the laser sources include multiple independent laser source modules, each set of the laser source modules can be independent of each other when emitting light, among which it is difficult to generate laser coherent, thereby significantly eliminating common speckle phenomena caused by laser coherence.

2. According to many technical solutions provided by the present invention, firstly, it is implemented that laser sources are fabricated by inkjet printing, which provides a new technical solution for the cheap and industrial manufacturing of various laser sources and their display devices; secondly, since it is easy to be implemented that the laser sources include multiple independent laser source modules, each set of the laser source modules can be independent of each other when emitting light, among which it is difficult to generate laser coherent, thereby significantly eliminating common speckle phenomena caused by laser coherence.

3. According to many technical solutions provided by the present invention, firstly, it is implemented that laser sources are fabricated by inkjet printing, which provides a new technical solution for the cheap and industrial manufacturing of various laser sources and their display devices; secondly, since it is easy to be implemented that the laser sources include multiple independent laser source modules, each set of the laser source modules can be independent of each other when emitting light, among which it is difficult to generate laser coherent superposition, thereby significantly eliminating common speckle phenomena caused by laser coherence.

EMBODIMENTS

To help those skilled in the art understand the technical solutions disclosed in the present invention, hereinafter, with reference to the embodiments and the accompanying drawings, the technical solution of every embodiment is described. The described embodiments are a part of the embodiments of the present invention, rather than all of the embodiments. Furthermore, the terms such as "first", "second", etc., in the present invention are used to distinguish different objects, and not meant to describe a specific order. Moreover, "including" and "having" and any variations thereof are intended to be inclusive and not exclusive. For example, processes, methods, systems, products, or devices that include a series of steps or units are not limited to include the listed steps or units, but optionally include unlisted steps or units, or optionally also include other inherent steps or units in these processes, methods, systems, products, or devices.

"Embodiments" mentioned herein mean that the accompanying specific features, structures, or characteristics described in the embodiments can be included in at least one embodiment of the present invention. The phrase appearing in various places in the description is neither necessarily referred to the same embodiments, nor independent or alternative embodiments that are mutually exclusive from other embodiments. Those skilled in the art can understand that the embodiments described herein can be combined with other embodiments.

In an embodiment of the present invention, it discloses a printing head module for printing laser sources, comprising: one or more printing heads, which are used for printing a plurality of laser light sources on a substrate successively or once for all;

ink used for printing comprises a luminescent dye, a matrix material and a solvent.

For the embodiment, firstly, it is implemented that laser sources are fabricated by inkjet printing, which provides a new technical solution for the cheap and industrial manufacturing of laser sources and their various display devices or lighting devices, etc.; secondly, since it is easy to be implemented that the multiple laser sources include multiple independent laser source modules, each set of the laser source modules can be independent of each other when emitting light, among which it is difficult to generate laser coherent, thereby significantly eliminating common speckle phenomena caused by laser coherence.

Figure 1:
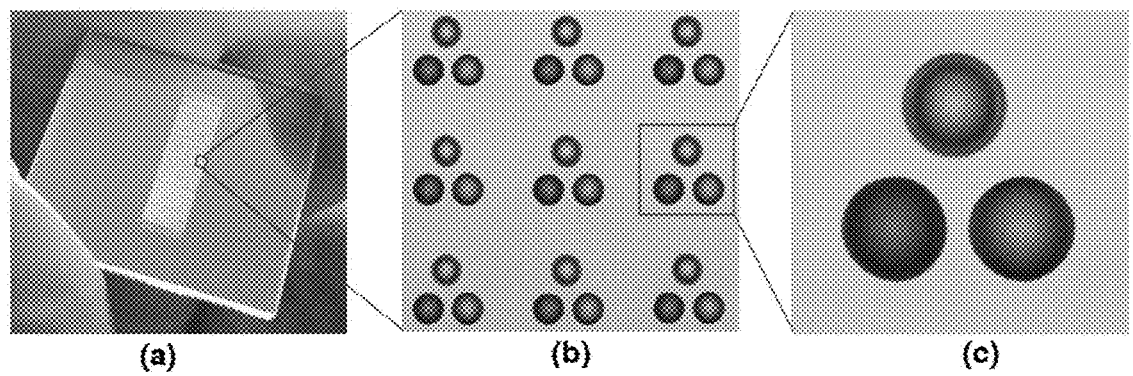
FIG. 1 is a schematic view of the inkjet printing process in an embodiment of the present invention.
Figure 2:
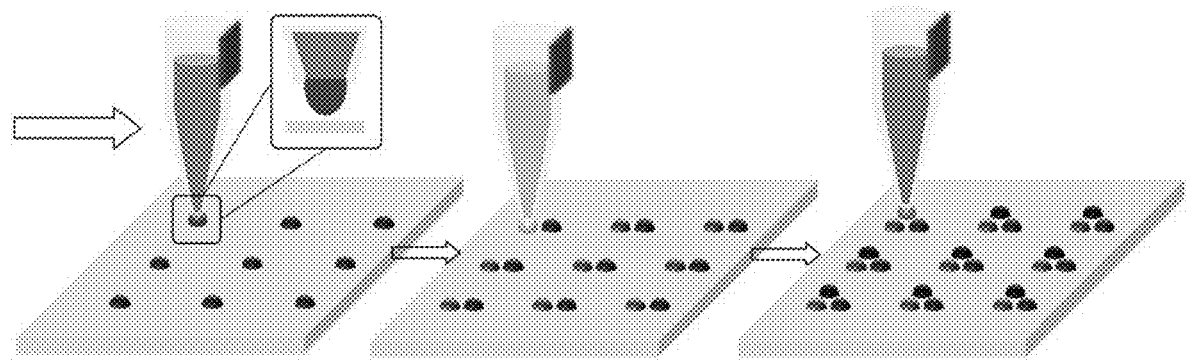
FIG. 2 is another schematic view of the inkjet printing process in an embodiment of the present invention.

Wherein, referring to FIG. 1, it shows individual printing heads representing different color ink, which are used for printing different light sources sequentially on a substrate. Each printing head corresponds to a color ink. Referring to FIG. 2, multiple printing heads correspond to one color ink.

In combination with FIG. 1 and FIG. 2, it is not difficult to see that the above-mentioned embodiment completely and clearly describes: one or more printing heads, which are used for printing a plurality of laser light sources on a substrate successively or once for all.

For the embodiment, referring to FIG. 1, when using one printing head, the printing head prints each light source in each set of the laser sources sequentially, for instance, successively printing three light sources, red, green and blue in the order of R, G and B; when using multiple printing heads, each light source in each set of the laser sources can be printed at a time by the multiple printing heads—understandably, the number of the printing heads in work should be larger than or equal to the number of the light sources in each set of the laser source modules, for example, larger than or equal to the number of RGB three light sources. FIG. 2 only shows multiple printing heads for a certain light source, for example, multiple printing heads for a red light source, and multiple printing heads for the other color are not shown.

As can be seen, it is necessary for inkjet printing to use ink for printing. Corresponding to the laser sources, the ink may adopt a polymer solution doped with laser dyes.

In another embodiment, a substrate of the laser panel can be used as long as it is beneficial for inkjet printing light sources on it. More preferably, it is necessary for the substrate to have a certain transparency. As an example, the substrate can be selected from any one of the following: (1) a silver mirror substrate coated with magnesium fluoride; (2) a Distributed Bragg Reflector (DBR) substrate, etc.

In another embodiment, the substrate needs to be pretreated, including making a lattice pattern corresponding to the positions of the laser sources on the clean substrate.

For the embodiment, the purpose of making a lattice pattern is to easily print the light sources according to the pattern.

In another embodiment, the lattice pattern is made by a plotter. As an example, the pretreated (including cleaning the substrate) substrate is first placed in the work area of the plotter; secondly, the plotter is used to draw a lattice corresponding to the positions of the laser sources on the substrate (note: understandably, the lattice is an array pattern, and the two are different expressions of the same concept in the present invention). Furthermore, the printing head modules can print the laser sources based on the manufactured array pattern.

It is easy to see that after printing each laser source, it may be necessary for the laser sources to have artificial interference in the curing process.

For the embodiment, it can be either natural curing or artificial curing, wherein, the time cost of natural curing is often relatively high, while the artificial curing is to accelerate the curing process. As far as the artificial curing is concerned, it can be done by using substrate heating method (usually heating with a constant temperature heating plate), or by other appropriate curing methods similar to heating, such as light irradiation (including ultraviolet or other spectral irradiation). Understandably, the choice of a curing method depends on the ink.

In another embodiment, the laser sources are used to be combined into multiple independent laser source modules; in each set of the multiple independent laser source modules, at least two of the light sources are capable of emitting light in different colors under the same excitation conditions.

As for the embodiment, this enables that color mixing in each set of the laser source modules is realized by using at least two light sources. More advantageously, in view of the embodiment in which it can be based on the same excitation conditions, and take the example of exciting the light sources by a femtosecond laser, those skilled in the art can obtain color mixing in at least two light sources only by using a femtosecond laser with a wavelength. That is, at least two light sources can be excited by a beam of light to achieve color mixing.

As can be seen, if the plural light sources are printed, the plural light sources by inkjet printing are all printed with ink, and the plural light sources are often microspherical, specifically hemispherical. During the operation of the printing head modules, the ink used for inkjet printing is liquid, and the fabricated light sources finally are solid, so in the process of inkjet printing, generally, each light source should not contact each other to avoid merging with each other.

In other words, each light source is often not in contact with each other, and there is space between them; if each light source is understood as a hemisphere, for the plural light sources, the first hemisphere and the second hemisphere (even the third hemisphere, etc.) are not tangent to each other.

Figure 3:
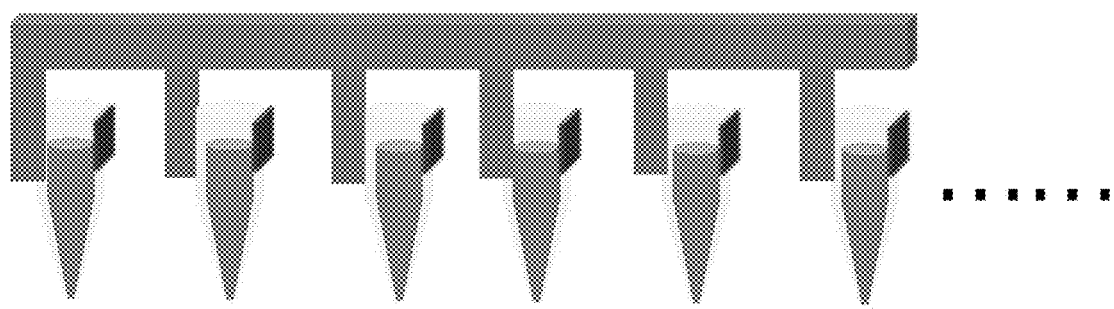
FIG. 3 is another schematic view of the laser sources in an embodiment of the present invention.

It can be understood that, during color mixing in at least two light sources, optionally, the at least two light sources are excited by a femtosecond laser, and only a femtosecond laser is used, then the femtosecond laser should be able to excite the at least two light sources at the same time. Thereby, since at least two of the light sources in a set of the plural light sources are capable of emitting light in different colors under the same excitation conditions, and it is assumed that the plural light sources are a set of the laser source modules, such as a set of three as shown in FIG. 3, by using the technology of the present invention, it can obtain color mixing in each set of the laser source modules. Color mixing is very meaningful, for example, a variety of different colors can be obtained by mixing colors according to the RGB three primary colors.

In particular, the present invention allows that at least two of the plural light sources are capable of emitting light in the same color under the same excitation conditions. For example, to obtain a strong light of a certain single color, the plural light sources in each set of the laser source modules may also be the same light sources, which can emit light in the same color under the same excitation conditions. The laser source can be used in the field of searchlights.

In another embodiment, the scale of the laser sources is millimeter, micrometer or even smaller.

For the embodiment, the smaller the scale of each light source is, the more favorable it is to achieve the higher-resolution image display effects. If any one of the laser source is regarded as a micro-hemisphere structure, according to the requirement of resolution, we can produce a micro-hemisphere structure with a size corresponding to the resolution. The size of the micro-hemisphere structure of any one of the light sources may be 15, 35, 45, 85, 100 microns, etc., or even smaller. If the size of the micro-hemisphere structure of any one of the light sources is in the order of millimeters, it is suitable for outdoor large screen display technology.

As can be seen, the optical mode of the micro-hemisphere structure is an echo wall mode. For the different size of the micro-hemisphere structure, the mode spacing is different. According to the theory of the echo wall mode, the smaller the hemisphere diameter is, the larger the mode spacing is, and the less number of modes exist in the gain region. When the number of modes is reduced to one, i.e., the single-mode laser, it can achieve the best monochromaticity.

Furthermore, when the hemisphere diameter of the micro-hemisphere structure corresponding to a light source is small to a specific size, and there is a corresponding relationship between the specific size and the light emitted by the light source as a single-mode laser, which can further increase the gamut range of laser. Illustratively rather than restrictively, the specific size is about 15 microns.

In another embodiment, the size of the printing heads is determined by the size of each light source.

As can be seen, the size of the printing heads is related to the hemisphere diameter of the above-described micro-hemisphere structure and is determined by the hemisphere diameter. The size of the printing heads can be selected in a range of 5, 10, 20, 30, 40, 50, 60 microns, etc. If it is necessary to produce a micro-hemisphere structure smaller than micronscale, when the size of the printing heads cannot be smaller, an inkjet printer capable of adjusting the size of ink droplets can be used and adaptively slightly improved to produce the light sources of the present invention by inkjet printing. As mentioned earlier, if a millimeter-scale micro-hemisphere structure is to be obtained, the size of the printing heads can be appropriately larger.

In another embodiment, by controlling a voltage applied to the printing heads, the sizes of ink droplets are adjusted. Other inkjet printer capable of adjusting the size of ink droplets can refer to the following patent documents in the prior art: CN1876375 A, U.S. Pat. Nos. 8,042,899 B2, 8,714,692 B1, 8,955,937 B2, 8,985,723 B2, 9,573,382 B1. These patent documents are here introduced in the description of the present invention, but it should be pointed out that these are only part of the related technologies of inkjet printers in the prior art. Since it is impossible to exhaust all technologies in the prior art, the remaining existing technologies that can be referred to and slightly improved are not listed.

In another embodiment, the luminescent dye comprises any one of the following: photoinduced laser dyes, electroluminescent laser dyes.

On the one hand, in the field of materials, there are photoinduced laser dyes, and also electroluminescent laser dyes. This provides many choices of luminescent dyes for those skilled in the art. On the other hand, if photoinduced laser dyes are used, the laser sources produced by inkjet printing mentioned above can be excited by other light, such as femtosecond lasers; understandably, the parameters selection of the corresponding femtosecond lasers is related to the characteristics of the light sources themselves formed after the ink is cured, especially the absorption spectra; if electroluminescent laser dyes are used, the laser sources can be excited by applying a voltage, such as a DC voltage or a pulse voltage; as an example, by virtue of the above-mentioned embodiment, those skilled in the art easily obtain by selecting dyes: a laser source that can be excited by applying a DC voltage of 3V. Depending on the materials, DC voltage may be changed to pulse voltage as needed. The pulse frequency and amplitude can match the refresh rate required for display.

In another embodiment, the luminescent dye comprises any one of the following: a blue-emitting oligostyrene dye, a green-emitting coumarin dye, a rhodamine series of dye, or a red-emitting hemicyanine dye.

For those skilled in the art, according to the requirement of luminescence colors, a dye with a corresponding emission wavelength can be selected. For example, the luminescent dye can also be selected from blue-emitting oligostyrene dyes, or green-emitting coumarin dyes such as coumarin 153, or coumarin 6, etc., or rhodamine series of dyes such as rhodamine 6G, etc., or red-emitting hemicyanine dyes. Because the embodiment realizes three kinds of red, green and blue light, RGB laser sources are easily produced with the printing head modules and the ink.

In another embodiment, the laser sources comprise RGB three primary color (red, green and blue) light sources.

Understandably, it is easy to mix colors according to the principle of RGB three primary colors. If a femtosecond laser is used for exciting and mixing colors, the femtosecond laser should be able to excite the RGB three light sources at the same time, and thus various colors are obtained by mixing colors according to the principle of three primary colors. Similarly, if DC voltage is used for exciting, more precise control can be achieved: for RGB three light sources, it can control voltages individually, thus mixing colors according to the principle of three primary colors to obtain various colors.

More specifically, the RGB three primary color light sources are three light sources and a set of light source modules independent of other laser sources. Thereby, it is not only easy to independently control and mix colors, but also maximize the reduction of speckle phenomena.

In another embodiment, the matrix material comprises any one of the following: polystyrene, polymethyl methacrylate, NOA series of light curable materials.

For the embodiment, the matrix material is used as a support material for the laser cavity, which is compatible with the laser dyes. Understandably, the better the material compatibility, the more suitable it is to be used as a matrix material. As can be seen, if the matrix material has good processability, it is also very advantageous. Wherein, NOA series of light curable materials comprise NOA1625, NOA68, etc.

In another embodiment, the ink uses any one of the following as a solvent: water, dichloromethane, chloroform, dimethylformamide. As can be seen, the embodiment is an example to provide a range of solvent selection.

In another embodiment, the ink may adopt any one of the following formulations:

(1) Three laser dyes, symmetrical diphenylethylene, fluorescein sodium and rhodamine B, are added into a BSA aqueous solution of 400 mg/mL, respectively, in which a mass ratio of one of the three dyes to BSA are all 1%. Finally, glycerol is added, in which a volume ratio of glycerol to water is 1:2.

(2) Three laser dyes, symmetrical diphenylethylene, fluorescein sodium and rhodamine B, are added into a BSA aqueous solution of 800 mg/mL, respectively, in which a mass ratio of one of the three dyes to BSA are all 1%. Finally, glycerol is added, in which a volume ratio of glycerol to water is 1:2.

(3) Three laser dyes, symmetrical diphenylethylene, fluorescein sodium and rhodamine B, are added into a BSA aqueous solution of 500 mg/mL, respectively, in which a mass ratio of diphenylethylene, fluorescein sodium and rhodamine B to BSA are 2%, 2%, and 1%, respectively. Finally, glycerol is added, in which a volume ratio of glycerol to water is 1:2.

(4) In addition to the dosage of the above specific formulations, there are still many choices, of which the concentration range of BSA aqueous solution is 300-1000 mg/mL. A mass ratios of rhodamine B, fluorescein sodium and symmetrical diphenylethylene to BSA is 1%-2%, 1%-3% and 1%-3%, respectively. A volume ratio of glycerol to water is 30%-100%.

In another embodiment, when the above formulations (1) to (3) are used, the laser sources are excited by 335-375 nm femtosecond lasers to emit light. It is easy to see that the wavelengths of the femtosecond lasers are determined by the absorption spectra of the light sources formed after the ink is cured.

For the above related embodiment, the matrix material is selected from Bovine Serum Albumin (i.e., BSA).

In another embodiment, the ink also comprises an auxiliary material; the auxiliary material comprises liquid prepolymer.

In particular, the auxiliary material may not be needed. If the auxiliary material is included, it not only helps to reduce the volatility of the solvent, but also ensures that the ink is not solidified in the printing process. Since it is impossible to record all ink formulations, those skilled in the art can foresee that: in some formulation, an auxiliary material may not be needed, as long as an solvent and a luminescent dye are properly selected, which still ensures that the volatility of the solvent is not obvious and the ink is not easy to be solidified, i.e., in the absence of the auxiliary material, it is possible that the inkjet printing process is basically unaffected by curing. Wherein, for the prepolymer, it is solidified only after light or heat treatment.

In another embodiment, the auxiliary material comprises any one of the following: heat curable epoxy resins, NOA series of light curable adhesives. It responds to the previous description of the auxiliary material.

As noted above, in another embodiment, each set of the laser source modules excites the plural light sources by a femtosecond laser. The femtosecond laser is further described with the following related embodiment.

As can be seen, the parameters of the specific femtosecond laser, such as wavelength, are determined by the light sources themselves formed after the above ink is cured. Being excited by the laser is inevitably related to the absorption spectra of the light sources themselves formed after the ink is cured, i.e., the wavelength herein is determined by the absorption spectra of the light sources formed after the ink is cured.

It is assumed that each set of the laser source modules comprises three light sources, each of which is fabricated by inkjet printing with a specific laser dye, so that: when the three light sources produced with the three dyes can be excited by the same wavelength of laser to emit light, those skilled in the art can choose a laser with this wavelength as the excitation condition; certainly, this does not exclude using a two- or three-wavelength laser as excitation conditions; that is, the wavelength of laser used for excitation can be flexibly selected that: it is possible to select one laser, two lasers or three lasers to excite each set of the laser source modules, and the wavelength of each laser is determined by the absorption spectra of the light sources which is formed after the above ink is cured. In particular, it is different from the prior art, in which multiple light beams in different colors are used for scanning illumination and image display, that the present invention only needs to use a laser to excite the light sources.

In another embodiment, the light sources can be excited by a DC voltage.

For the embodiment, it reveals another excitation way. Certainly, whether it is excited by a femtosecond laser, or DC voltage or pulse voltage, depends on the light sources themselves formed after the ink is cured. In other words, the laser dyes obviously have characteristic of being able to be excited by a certain DC voltage, for example, the DC voltage is about 3V.

In another embodiment, when the sources are used for displaying an image, the light emitted by each set of the excited laser source modules (i.e., include multiple laser sources) corresponds to one pixel of the image.

For the embodiment, it means that each set of the laser source modules is in pixel level. It is beneficial for achieving finer image display and promoting the application of laser technology in the field of high definition and super definition displays.

In another embodiment, when a DC voltage excitation mode is used, each set of the laser source modules can be driven by thin-film transistors or by other thin-film transistors: for example, oxide semiconductor thin-film transistors, polycrystalline silicon thin-film transistors, amorphous silicon thin-film transistors. Compared with the excitation mode by one or more femtosecond lasers, the DC voltage excitation mode can control each pixel individually, and even simultaneously, which is very beneficial for a pixel-level laser panel. Incidentally, the excitation mode can also significantly reduce the volume of equipment in the field of laser displays.

In another embodiment, the space between the laser sources is about 2.5-4 times their diameters.

It is easy to understand that the space here can be changed according to the requirements of the light sources.

In another embodiment, the temperature and time of the printed light sources during curing are determined by the inherent characteristics of ink. For example, BSA aqueous system and polystyrene/dichloromethane system are heated at 60 degrees Celsius for one hour, while NOA series materials can be irradiated by ultraviolet light for several minutes.

In another embodiment, for each group of RGB three primary color light sources, the diameters of the three primary color light sources are basically the same and located at three vertices of an equilateral triangle, respectively, and a length of the equilateral triangle exceed 10%-30% of the diameters. Obviously, the relationship between the length and the diameter can also be changed according to the requirements of the light sources.

Referring to FIG. 1, in an embodiment of the present invention, it shows a system for printing laser sources, comprising:

printing head modules, an ink cartridge, and a substrate;

the printing head modules are used to inkjet print each laser source on the substrate;

the ink cartridge is used to store ink; wherein, the ink comprises a luminescent dye, a matrix material and a solvent.

For the embodiment, firstly, it is implemented that laser sources are fabricated by inkjet printing, which provides a new technical solution for the cheap and industrial manufacturing of laser sources and their various display devices or lighting devices, etc.; secondly, since it is easy to be implemented that the laser sources include multiple independent laser source modules, each set of the laser source modules can be independent of each other when emitting light, among which it is difficult to generate laser coherent, thereby significantly eliminating common speckle phenomena caused by laser coherence.

As can be seen, it is necessary for inkjet printing to use ink for printing. Corresponding to the laser sources, the ink may adopt a polymer solution doped with laser dyes.

In another embodiment, the system further includes: manufacturing lattice modules, which are used to make a lattice pattern corresponding to the positions of the laser sources on a clean substrate.

For the embodiment, the purpose of making a lattice pattern is to easily print light sources according to the pattern.

In another embodiment, the system further includes: curing modules, which are used to solidify the laser sources after printing each laser source.

For the embodiment, the curing is as described in the above embodiment.

In another embodiment, the light sources can be excited by DC voltage.

For the embodiment, it reveals another excitation way. Certainly, whether it is excited by a femtosecond laser, or DC voltage or pulse voltage, depends on the light sources themselves formed after the ink is cured. In other words, the laser dyes obviously have characteristic of being able to be excited by a certain DC voltage, for example, a DC voltage is about 3V.

In another embodiment, the inkjet printer comprise one or more printing heads, which are used for printing a plurality of laser light sources on a substrate successively or once for all.

For the embodiment, referring to FIG. 1, when using one printing head, the printing head prints each light source in each set of the laser sources sequentially, for instance, successively printing three light sources, red, green and blue in the order of R, G and B; when using multiple printing heads, each light source in each set of the laser sources can be printed at one time by the multiple printing heads—understandably, the number of the printing heads in work should be larger than or equal to the number of the light sources in each set of the laser source modules, for example, larger than or equal to the number of RGB three light sources. FIG. 2 only shows multiple printing heads for a certain light source, such as multiple printing heads for a red light source, and other light sources for the plural light sources are not shown.

Referring to FIG. 1, in an embodiment of the present invention, it shows a method for printing laser sources, comprising the following steps:

S100: placing the pretreated substrate in the work area of an inkjet printer, wherein the ink used in the inkjet printer comprises a luminescent dye, a matrix material and a solvent;

S200: using the ink to print each laser source on the substrate.

For the embodiment, firstly, it is implemented that laser sources are fabricated by inkjet printing, which provides a new technical solution for the cheap and industrial manufacturing of laser sources and their various display devices or lighting devices, etc.; secondly, since it is easy to be implemented that the multiple laser sources include multiple independent laser source modules, each set of the laser source modules can be independent of each other when emitting light, among which it is difficult to generate laser coherent superposition, thereby significantly eliminating common speckle phenomena caused by laser coherence.

As can be seen, it is necessary for inkjet printing to use ink for printing. Corresponding to the laser sources, the ink may adopt a polymer solution doped with laser dyes.

In another embodiment, the pretreatment comprises the following steps:

S101: making a lattice pattern corresponding to the positions of the laser sources on a clean substrate.

For the embodiment, the purpose of making a lattice pattern is to easily print light sources according to the pattern.

In another embodiment, the method further comprises the following steps:

S300: curing the laser sources after printing each laser source.

For the embodiment, the curing is as described in the above embodiment.

In another embodiment, the light sources can be excited by DC voltage or pulse voltage.

For the embodiment, it reveals another excitation way. Certainly, whether it is excited by a femtosecond laser, or DC voltage or pulse voltage, depends on the light sources themselves formed after the ink is cured. In other words, the laser dyes obviously have characteristic of being able to be excited by a certain DC voltage, for example, a DC voltage is about 3V. Depending on the materials, DC voltage may be changed to pulse voltage as needed. The pulse frequency and amplitude can match the refresh rate required for display.

In another embodiment, when a DC voltage or a pulse voltage excitation mode is used, each set of the laser source modules can be driven by thin-film transistors or by other thin-film transistors: for example, oxide semiconductor thin-film transistors, polycrystalline silicon thin-film transistors, amorphous silicon thin-film transistors. Compared with the excitation mode by one or more femtosecond lasers, the DC voltage or pulse voltage excitation mode can control each pixel individually, and even simultaneously, which is very beneficial for a pixel-level laser source device. Incidentally, the excitation mode can also significantly reduce the volume of equipment in the field of laser displays.

In another embodiment, the printing head modules comprise one or more printing heads, which are used for printing a plurality of laser light sources on a substrate successively or once for all.

For the embodiment, referring to FIG. 1, when using one printing head, the printing head prints each light source in each set of the laser sources sequentially, for instance, successively printing three light sources, red, green and blue in the order of R, G and B; when using multiple printing heads, each light source in each set of the laser sources can be printed at one time by the multiple printing heads—understandably, the number of the printing heads in work should be larger than or equal to the number of the light sources in each set of the laser source modules, for example, larger than or equal to the number of RGB three light sources. FIG. 2 only shows multiple printing heads for a certain light source, such as multiple printing heads for a red light source, and other light sources for the plural light sources are not shown.

In the above embodiments, the description of every embodiment has its own focus, and the parts that are not detailed in some embodiment can be referred to the related descriptions of other embodiments.

As described above, the above embodiments are only used to illustrate the technical solutions of the present invention, rather than limiting the present invention; although the present invention is described in detail with reference to the above embodiments, it should be understood for those skilled in the art that the technical solutions described in the embodiments can be modified, or some of the technical features can be equivalently alternated; and the modifications or equivalents do not make the essence of the corresponding technical solutions depart from the scope of the technical solutions of every embodiment of the present invention.

The invention claimed is:

1. A system for printing laser sources, comprising:
   a printing head module having a plurality of printing heads;
   an ink cartridge fluidly connected to the printing head module, wherein the ink cartridge stores a blue-emitting ink, a green-emitting ink, and a red-emitting ink, wherein the blue-emitting ink comprises an oligostyrene dye, the green-emitting ink comprises a coumarin dye, and the red-emitting ink comprises a hemicyanine dye, a rhodamine series of dye, or a mixture thereof, wherein the plurality of printing heads comprises at least one first printing head, one second printing head, and one third printing head, wherein the first printing head is configured to receive and to eject the blue-emitting ink, the second printing head is configured to receive and to eject the green-emitting ink, and the third printing head is configured to receive and to eject the blue-emitting ink; and
   a substrate configured to support droplets of the blue-emitting ink, droplets of the green-emitting ink, and droplets of the red-emitting ink ejected from the plurality of printing heads, and wherein each of the blue-emitting ink, the green-emitting ink, and the red-emitting ink further comprises a matrix and a solvent, wherein the matrix is selected from polystyrene, polymethyl methacrylate, and mixtures thereof.

2. The system according to claim 1, further comprising: a manufacturing lattice module configured to arrange droplets of the blue-emitting ink, droplets of the green-emitting ink, and droplets of the red-emitting ink into a lattice pattern corresponding to positions of the laser sources on the substrate.

3. The system according to claim 2, further comprising a curing module configured to cure ink droplets.

4. The system according to claim 1, wherein sizes of the printing heads are determined by a size of each light source.

5. The system according to claim 1, wherein each of the blue-emitting ink, the green-emitting ink, and the red-emitting ink further comprises a matrix and a solvent, wherein the matrix is selected from polystyrene, polymethyl methacrylate, and mixtures thereof.

6. A method for printing an array of laser sources, comprising:
   placing a pretreated substrate in a work area of an inkjet printer;
   defining positions of the array of laser sources on the pretreated substrate; and
   printing the array of laser sources on the substrate, wherein each of the array of laser sources comprises a droplet of a blue-emitting ink comprising a blue-emitting oligostyrene dye, a droplet of a green-emitting ink comprising a green-emitting coumarin dye, and a droplet of a red-emitting ink comprising a red-emitting hemicyanine dye, a rhodamine series of dye, or a mixture thereof; and
   adjusting a voltage applied to a printing head in the ink jet printer to adjust a size of the ink droplets.

7. The method according to claim 6, wherein a size each of the array of laser sources is smaller than a millimeter.

8. The method according to claim 6, wherein in each of the array of laser sources, the droplet of the blue-emitting ink, the droplet of the green-emitting ink, and the droplet of the red-emitting ink are of substantially a same diameter and are located at three vertices of an equilateral triangle, respectively, and a length of the equilateral triangle exceed 10%-30% of the diameter, and a space between adjacent droplets is about 2.5-4 times the diameter.

9. The method according to claim 6, further comprising curing the ink droplets after printing each laser source.

10. A system for printing laser sources, comprising:
    a printing head module having a plurality of printing heads;
    an ink cartridge fluidly connected to the printing head module, wherein the ink cartridge stores a blue-emitting ink, a green-emitting ink, and a red-emitting ink, wherein the blue-emitting ink comprises an oligostyrene dye, the green-emitting ink comprises a coumarin dye, and the red-emitting ink comprises a hemicyanine dye, a rhodamine series of dye, or a mixture thereof, wherein the plurality of printing heads comprises at least one first printing head, one second printing head, and one third printing head, wherein the first printing head is configured to receive and to eject the blue-emitting ink, the second printing head is configured to receive and to eject the green-emitting ink, and the third printing head is configured to receive and to eject the blue-emitting ink; and
    a substrate configured to support droplets of the blue-emitting ink, droplets of the green-emitting ink, and droplets of the red-emitting ink ejected from the plurality of printing heads,
    wherein each of the blue-emitting ink, the green-emitting ink, and the red-emitting ink further comprises Bovine Serum Albumin (BSA), glycerol, and water, wherein a concentration of the corresponding dye in the ink is 300-1000 mg/mL, a mass ratio of the corresponding dye to BSA in the ink is 1-3%, and a volume ratio of glycerol to water ranges from 1:1 to 1:4.

11. The system according to claim 10, wherein the concentration of the corresponding dye in the ink is 400, 500, or 800 mg/mL, a mass ratio of the corresponding dye to BSA in the ink is 1%, and a volume ratio of glycerol to water is 1:2.

* * * * *